United States Patent
Kuo et al.

(10) Patent No.: US 11,164,822 B1
(45) Date of Patent: Nov. 2, 2021

(54) STRUCTURE OF SEMICONDUCTOR DEVICE AND METHOD FOR BONDING TWO SUBSTRATES

(71) Applicant: United Microelectronics Corp., Hsinchu (TW)

(72) Inventors: Chung-Hsing Kuo, Taipei (TW); Chun-Ting Yeh, Taipei (TW); Ming-Tse Lin, Hsinchu (TW); Hui-Ling Chen, Kaohsiung (TW); Chien-Ming Lai, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/035,385

(22) Filed: Sep. 28, 2020

(51) Int. Cl.
*H01L 23/544* (2006.01)
*H01L 23/488* (2006.01)
*H01L 23/00* (2006.01)

(52) U.S. Cl.
CPC .......... *H01L 23/544* (2013.01); *H01L 23/488* (2013.01); *H01L 24/03* (2013.01); *H01L 24/05* (2013.01); *H01L 24/80* (2013.01)

(58) Field of Classification Search
CPC combination set(s) only.
See application file for complete search history.

(56) References Cited

U.S. PATENT DOCUMENTS

| | | | |
|---|---|---|---|
| 8,810,048 B2 | 8/2014 | Kuang | |
| 9,048,283 B2 | 6/2015 | Liu et al. | |
| 9,165,793 B1 * | 10/2015 | Wang | H01L 24/83 |
| 9,852,988 B2 | 12/2017 | Enquist et al. | |
| 10,262,963 B2 | 4/2019 | Enquist | |
| 2014/0022787 A1 * | 1/2014 | Park | F21K 9/61 362/240 |
| 2014/0043549 A1 * | 2/2014 | Taniguchi | G02F 1/13394 349/15 |
| 2014/0342479 A1 * | 11/2014 | Marchena | H01L 21/8258 438/26 |
| 2015/0179292 A1 * | 6/2015 | Sato | G21K 1/067 378/154 |
| 2016/0254336 A1 * | 9/2016 | Zhang | G02F 1/137 349/33 |
| 2017/0062366 A1 * | 3/2017 | Enquist | H01L 24/89 |
| 2019/0043843 A1 * | 2/2019 | Liu | H01L 33/505 |
| 2019/0165025 A1 * | 5/2019 | Jhy-Jyi | H01L 27/14634 |
| 2020/0159133 A1 * | 5/2020 | Yan | H01L 23/544 |
| 2020/0411562 A1 * | 12/2020 | Han | H01L 24/14 |
| 2021/0057427 A1 * | 2/2021 | Oh | H01L 27/11582 |

(Continued)

*Primary Examiner* — Mamadou L Diallo
(74) *Attorney, Agent, or Firm* — J.C. Patents

(57) ABSTRACT

A structure of semiconductor device is provided. The structure includes a first bonding pattern, formed on a first substrate. A first grating pattern is disposed on the first substrate, having a plurality of first bars extending along a first direction. A second bonding pattern is formed on a second substrate. A second grating pattern, disposed on the second substrate, having a plurality of second bars extending along the first direction. The first bonding pattern is bonded to the second bonding pattern. One of the first grating pattern and the second grating pattern is stacked over and overlapping at the first direction with another one of the first grating pattern and the second grating pattern. A first gap between adjacent two of the first bars is different from a second gap between adjacent two of the second bars.

21 Claims, 6 Drawing Sheets

(56) References Cited

U.S. PATENT DOCUMENTS

| | | | |
|---|---|---|---|
| 2021/0143115 A1* | 5/2021 | Wu | H01L 24/03 |
| 2021/0159216 A1* | 5/2021 | Wu | H01L 25/0657 |
| 2021/0216006 A1* | 7/2021 | Cui | G03F 7/7085 |

* cited by examiner

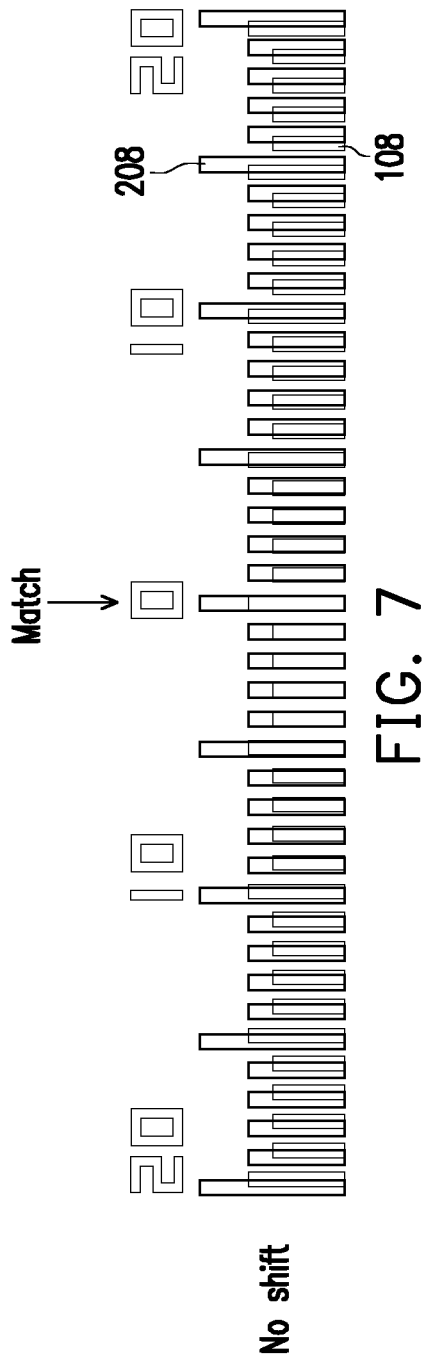
FIG. 7
No shift
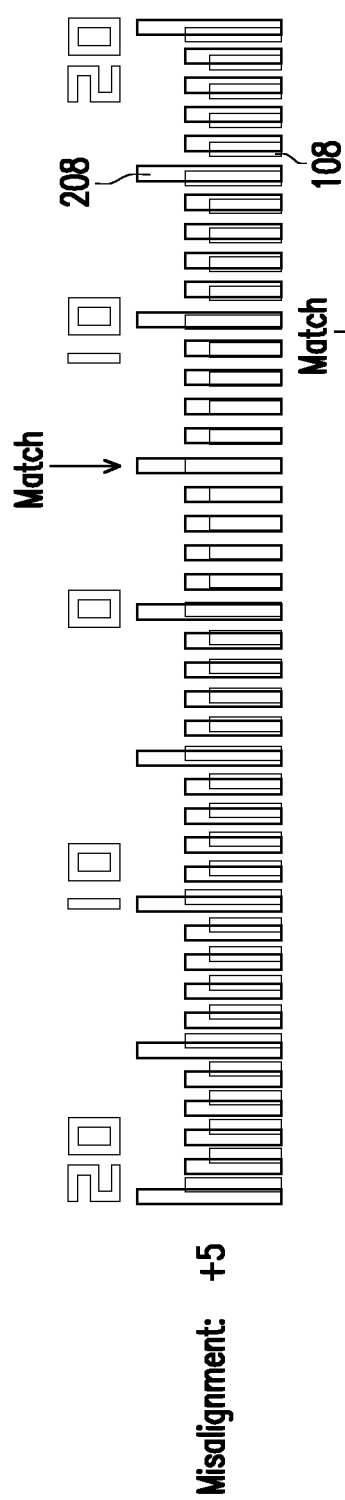
FIG. 8
Misalignment: +5
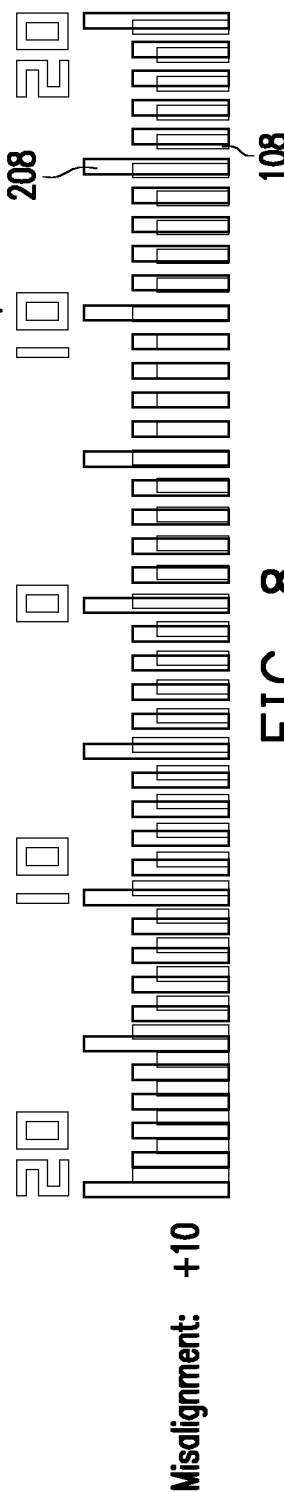
Misalignment: +10

STRUCTURE OF SEMICONDUCTOR DEVICE AND METHOD FOR BONDING TWO SUBSTRATES

BACKGROUND OF THE INVENTION

Field of the Invention

The invention relates to a semiconductor fabrication technology, in particular, to a structure of semiconductor device and method for bonding two substrates.

Description of Related Art

In development for the semiconductor fabrication technology, the fabrication may be divided into two parts, in which the corresponding circuits are respectively fabricated on two substrates. To the individual substrate, after accomplishing the fabrication of the circuit, the surface of the substrate, which is to be bonding to the circuit of another substrate, would be formed with a plurality of bonding pads at the corresponding locations. Then, the two substrates are bonded according to the packaging technology. At the ideal condition, the bonding pads of the two substrates would be precisely bonded together, to form the whole integrated circuit.

In bonding process for the two substrates, the two substrates need to be aligned therebetween, before performing the bonding the substrates. In a conventional way, each substrate is fabricated to have an alignment mark together with the actual integrated circuit. The alignments marks in the two substrates are compared to measure the aligning quality between the two substrates.

As usually known, if the misalignment occurs, at least the bond pads such as the metal pads in the two substrates would also shift to each other, and a bond surface would be in contact with the dielectric layer, which is an inter-layer dielectric and surrounds the bond pad. The bonding process usually includes an annealing process in high temperature to bond the metallic material of the bond pads. Then, under the situation with severe misalignment, a void would occur at the interface between the metal pad and the dielectric layer. It causes a defect in bonding quality. To the alignment marks, if the void occurs on the metal alignment marks, the alignment quality with the capability to measure the alignment quality would get worse.

A design of the alignment marks to improve the bonding process for boding two substrates is still under development.

SUMMARY OF THE INVENTION

The invention proposes the alignment marks respectively formed in two substrates. When the two substrates are bonded, the alignment marks are in overlapping when looking over the plane of the substrate. In addition, patterns of the alignment marks allow to efficiently measure the alignment quality between the two substrates.

In an embodiment, the invention provides a structure of semiconductor device. The structure includes a first bonding pattern, formed on a first substrate. A first grating pattern is disposed on the first substrate, having a plurality of first bars extending along a first direction. A second bonding pattern is formed on a second substrate. A second grating pattern, disposed on the second substrate, having a plurality of second bars extending along the first direction. The first bonding pattern is bonded to the second bonding pattern. One of the first grating pattern and the second grating pattern is stacked over and overlapping at the first direction with another one of the first grating pattern and the second grating pattern. A first gap between adjacent two of the first bars is different from a second gap between adjacent two of the second bars.

In an embodiment, as to the structure of semiconductor device, a bar end of the first bars is matched to a bar end of the second bars at one side of the first bars.

In an embodiment, as to the structure of semiconductor device, a bar end of the first bars is constantly shifted from a bar end of the second bars at one side of the first bars.

In an embodiment, as to the structure of semiconductor device, one of the first bars and the second bars is numbered as a plurality of numbered bars while another one is a plurality of comparison bars. The numbered bars have a reference bar assigned with a reference number, wherein a misalignment level is determined by a shift from the reference bar for a detected one of the numbered bars being most matching to one of the comparison bars.

In an embodiment, as to the structure of semiconductor device, the reference number as assigned to the reference bar is "0", a first side with respect to "0" is negatively numbered and a second side with respect to "0" is positively numbered.

In an embodiment, as to the structure of semiconductor device, the first bars are longer than the second bars or the first bars are shorter than the second bars.

In an embodiment, as to the structure of semiconductor device, further, a third grating pattern is disposed on the first substrate, having a plurality of third bars extending along a second direction perpendicular to the first direction. a fourth grating pattern is disposed on the second substrate, having a plurality of fourth bars extending along the second direction. One of the third grating pattern and the fourth grating pattern is stacked over and overlapping at the second direction with another one of the third grating pattern and the fourth grating pattern. A third gap between adjacent two of the third bars is different from a fourth gap between adjacent two of the fourth bars.

In an embodiment, as to the structure of semiconductor device, a bar end of the third bars is matched to a bar end of the fourth bars at one side of the first bars.

In an embodiment, as to the structure of semiconductor device, a bar end of the third bars is constantly shifted from a bar end of the fourth bars at one side of the first bars.

In an embodiment, as to the structure of semiconductor device, one of the third bars and the fourth bars is numbered as a plurality of numbered bars while another one is a plurality of comparison bars. The numbered bars have a reference bar assigned with a reference number, wherein a misalignment level is determined by a shift from the reference bar for a detected one of the numbered bars being most matching to one of the comparison bars.

In an embodiment, as to the structure of semiconductor device, the reference number as assigned to the reference bar is "0", a first side with respect to "0" is negatively numbered and a second side with respect to "0" is positively numbered.

In an embodiment, as to the structure of semiconductor device, the third bars are longer than the fourth bars or the third bars are shorter than the fourth bars.

In an embodiment, the invention also provides a method for bonding two substrates. The method includes providing a first substrate, having a first bonding pattern and a first grating pattern at a top of the first substrate, wherein the first grating pattern has a plurality of first bars extending along a first direction. In addition, a second substrate is provided, having a second bonding pattern and a second grating pattern at a top of the second substrate, wherein the second grating pattern has a plurality of second bars extending along the first direction. The first bonding pattern is dielectric bonding to the second bonding pattern, wherein an alignment condition between the first grating pattern and the second grating pattern is optically checked and accordingly adjusted to satisfy within a range. Annealing bonding is performed on the first bonding pattern and the second bonding pattern to have metal bonding. One of the first grating pattern and the second grating pattern is stacked over and overlapping at the first direction with another one of the first grating pattern and the second grating pattern. A first gap between adjacent two of the first bars is different from a second gap between adjacent two of the second bars.

In an embodiment, as to the method for bonding two substrate, a bar end of the first bars is matched or constantly shifted from a bar end of the second bars at one side of the first bars.

In an embodiment, as to the method for bonding two substrate, one of the first bars and the second bars is numbered as a plurality of numbered bars while another one is a plurality of comparison bars. The numbered bars have a reference bar assigned with a reference number, wherein a misalignment level is determined by a shift from the reference bar for a detected one of the numbered bars being most matching to one of the comparison bars.

In an embodiment, as to the method for bonding two substrate, the reference number as assigned to the reference bar is "0", a first side with respect to "0" is negatively numbered and a second side with respect to "0" is positively numbered.

In an embodiment, as to the method for bonding two substrate, the first bars are longer than the second bars or the first bars are shorter than the second bars.

In an embodiment, as to the method for bonding two substrate, the first substrate and the second substrate as provided further includes: a third grating pattern, disposed on the first substrate, having a plurality of third bars extending along a second direction perpendicular to the first direction; and a fourth grating pattern, disposed on the second substrate, having a plurality of fourth bars extending along the second direction. One of the third grating pattern and the fourth grating pattern is stacked over and overlapping at the second direction with another one of the third grating pattern and the fourth grating pattern. A third gap between adjacent two of the third bars is different from a fourth gap between adjacent two of the fourth bars.

In an embodiment, as to the method for bonding two substrate, one of the third bars and the fourth bars is numbered as a plurality of numbered bars while another one is a plurality of comparison bars. The numbered bars have a reference bar assigned with a reference number, wherein a misalignment level at the second direction is determined by a shift from the reference bar for a detected one of the numbered bars being most matching to one of the comparison bars.

In an embodiment, as to the method for bonding two substrate, the third bars are longer than the fourth bars or the third bars are shorter than the fourth bars.

In an embodiment, as to the method for bonding two substrate, the alignment condition is optically checked by analyzing an overlapping image of the first grating pattern and the second grating pattern as shot by infra-red light.

BRIEF DESCRIPTION OF THE DRAWINGS

In order to make the aforementioned and other objectives and advantages of the present invention comprehensible, embodiments accompanied with figures are described in detail below.

FIG. 7 is a drawing, schematically illustrating schematically illustrating a structure of the alignment marks of the two substrates in plane view after bonding as well aligned, according to an embodiment of the invention.

FIG. 8 is a drawing, schematically illustrating structure of the alignment marks of the two substrates in plane view after bonding with misalignment as measured, according to an embodiment of the invention.

DESCRIPTION OF THE EMBODIMENTS

The invention is directed to the semiconductor device, which is formed from two circuit parts respectively formed in two substrates. The two parts of the integrated circuit are then bonded as a whole circuit of the integrated circuit.

To have the alignment of the bond pads in the two substrates, each substrate has also been fabricated with an alignment mark. The two alignment marks are used to properly align to each other, so that the bond pads in the two substrates are properly aligned.

However, the alignment of the bond pads belonging to the integrated circuit is determined by the alignment of the alignment marks in the two substrates. The quality of the alignment marks is essential to decide the alignment condition. If the design of the alignment marks is not proper, the alignment performance between the two substrates may be not at the intend quality. It implies that a misalignment may occur. Then bonding condition between the bond pad would get misalignment, too.

The invention has looked into the issues of misalignment and proposes the structure of alignment marks. The alignment condition may be effectively improved. Multiple embodiments are provided for describing the invention but the invention is not just limited to the embodiments.

Figure 1:
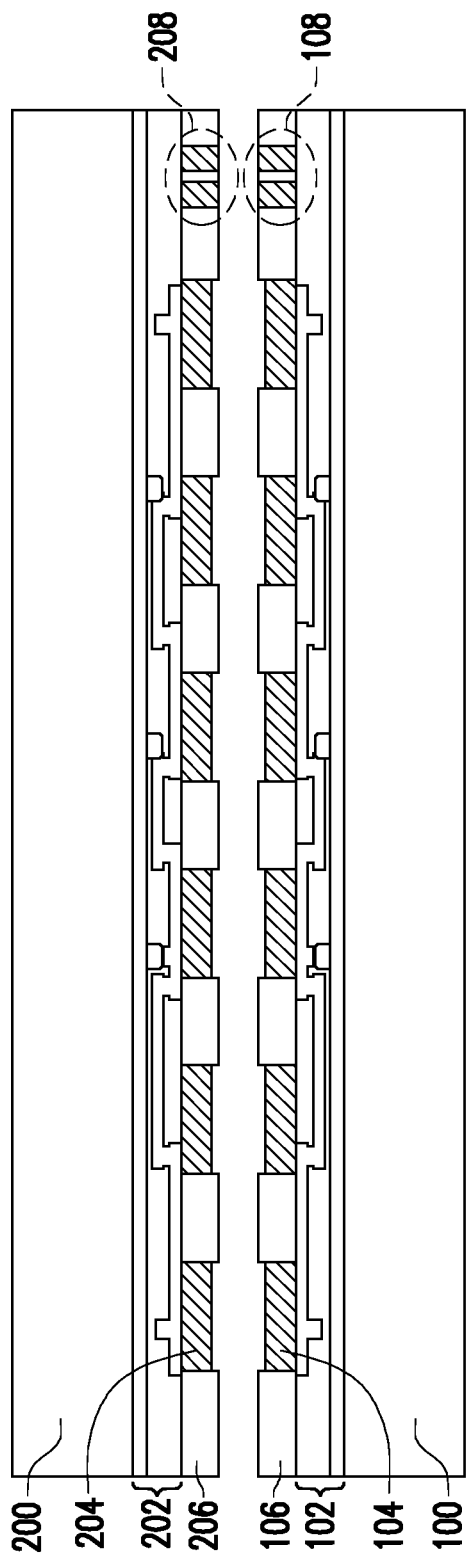
FIG. 1 is a drawing, schematically illustrating a cross-section structure of two substrates as separately fabricated, according to an embodiment of the invention.

FIG. 1 is a is a drawing, schematically illustrating a cross-section structure of two substrates as separately fabricated, according to an embodiment of the invention. Referring to FIG. 1, the while integrated circuit are divided into two circuit parts, which are respectively fabricated in one substrate 100 and another substrate 200. In the substrate 100, the device layer 102 are formed on the substrate. In an embodiment, the device layer 102 includes the circuit part without illustrated in detail, in which the interconnection is shown. The bond pattern 104 with multiple bonds as surrounded by the dielectric layer 106 is formed on the device layer 102 in connection to the interconnection, so as to be bonded with another circuit part in the substrate 200.

Likewise, the substrate 200 has also been fabricated with the device layer 202, the bond pattern 204 and the dielectric layer 206 surrounding the bond pattern 204. The device layer 202 includes another circuit part of the whole integrated circuit.

In an embodiment, the bond pattern 104 in the substrate 100 and the bond pattern 204 in the substrate 200 are identical and to be bonded together for electric connection.

In addition, to precisely bonded for the bond patterns 104, 204, the alignment mark 108 and the alignment mark 208 are also respectively formed in the two substrates 100, 200.

Figure 2:
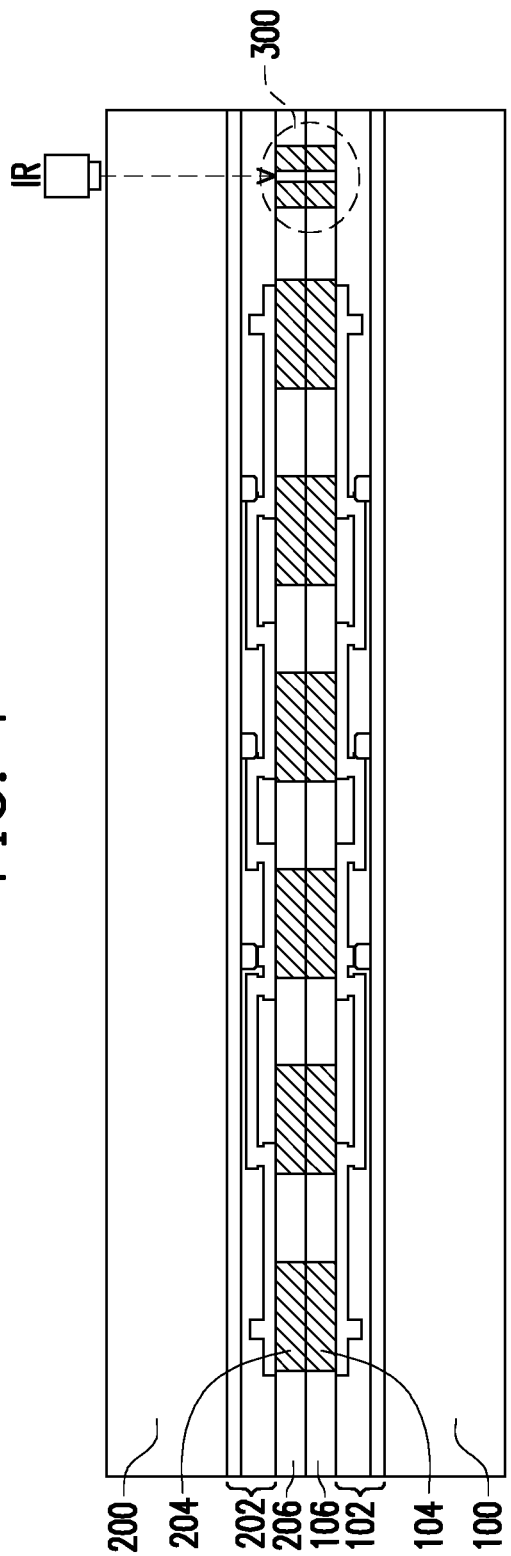
FIG. 2 is a drawing, schematically illustrating a cross-sectional structure of two substrates as bonded, according to an embodiment of the invention.

FIG. 2 is a drawing, schematically illustrating a cross-sectional structure of two substrates as bonded, according to an embodiment of the invention. Referring to FIG. 2, after the bonding process, the substrate 100 and the substrate 200 are bonded together, in which the alignment mark 108 and the alignment mark 208 may be monitored by IR device to check whether or not the two substrates 100, 200 are well aligned, and then to make sure the bonds of the bond patterns 104, 204 are properly bonded as well. After binding, the alignment mark 108 and the alignment mark 208 form the structure 300, as viewed or monitored by the IR device.

The alignment condition between the alignment mark 108 and the alignment mark 208 would be essential to decide the bonding condition of the bond patterns 104 204. The structure of the alignment mark 108 and the alignment mark 208 may also determine the aligning quality in measurement.

Figure 3A:
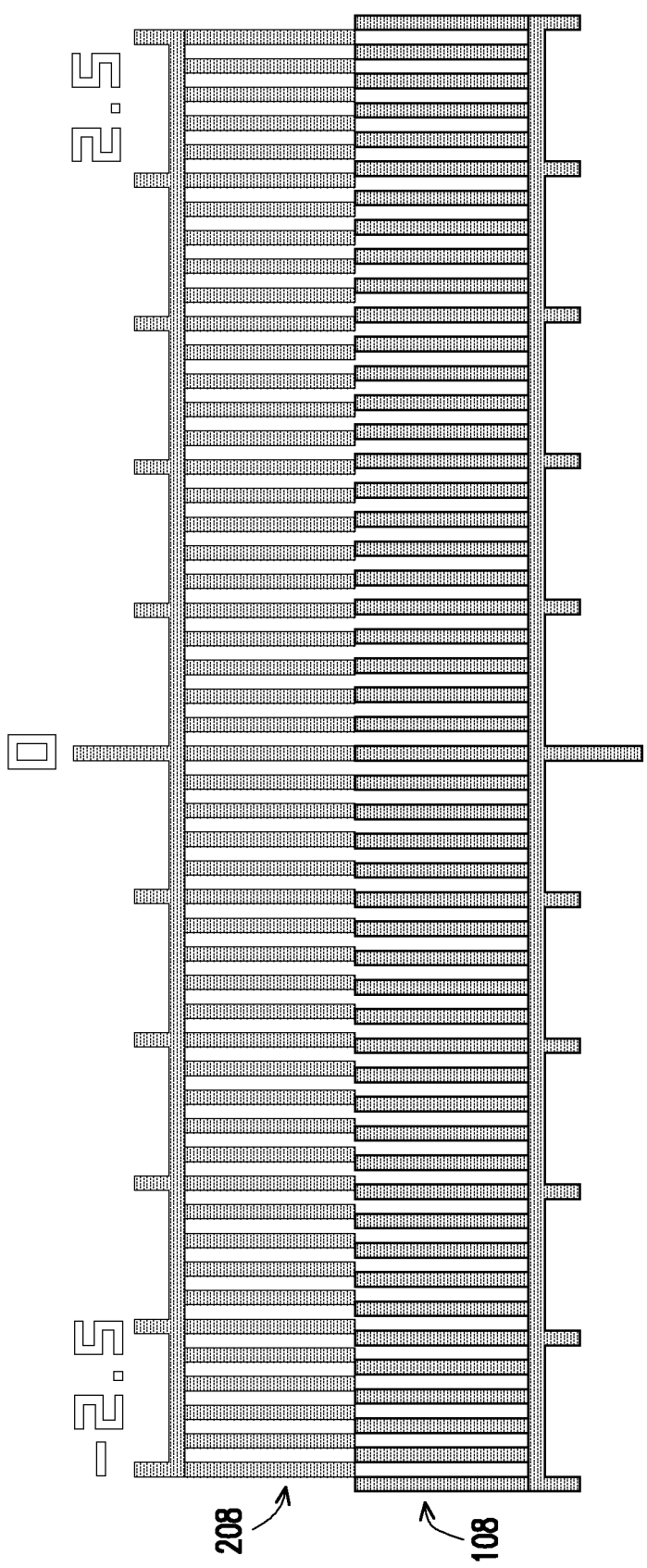
FIG. 3A and FIG. 3B are drawings, schematically illustrating structures of the alignment marks of the two substrates in plane view after bonding, according to an embodiment of the invention.
Figure 3B:
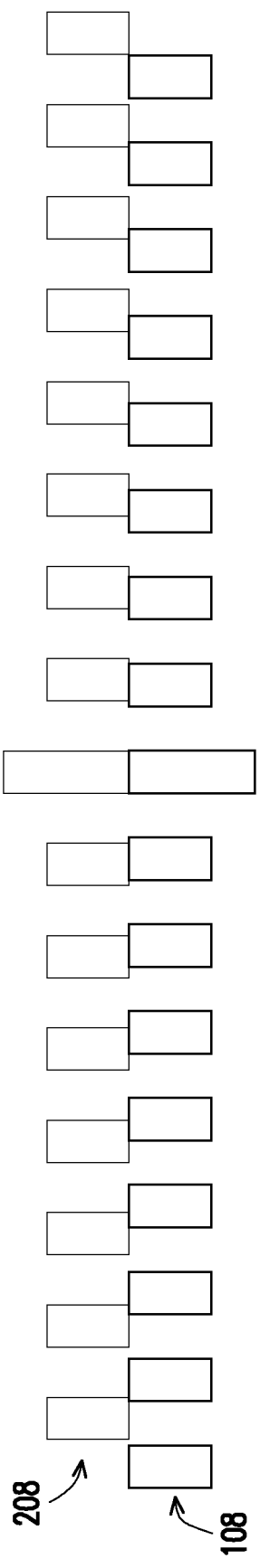

The invention has looked into alignment mechanism between the alignment mark 108 and the alignment mark 208. FIG. 3A and FIG. 3B are drawings, schematically illustrating structures of the alignment marks of the two substrates in plane view after bonding, according to an embodiment of the invention.

Referring to FIG. 3A, in a design of the alignment mark 108 and the alignment mark 208, they may be a grating pattern, like the indication bars of a ruler. The geometric relation in the FIG. 3A is the image taken by the IR device from top plane of the substrate as also referring to FIG. 2. As viewed in the plane view after bonding the two substrates 100, 200, the grating patterns of the alignment marks 108, 208 in ruler structures for comparison, in which the measurement of alignment may be like the measurement mechanism of a Vernier caliper. Here, in a straight way, the grating patterns of the alignment mark 108 and the alignment mark 208 as viewed from the IR device in a plane image are not overlapped but abutting at the interfacing edges. The alignment condition is determined by the location of the matched bars, which is located at the center, in an embodiment.

Referring to FIG. 3B, as noted, the grating patterns of the alignment marks 108, 208 may have various designs in size for easy detection. The measurement mechanism is the same.

As to the alignment marks 108, 208 in FIG. 3A and FIG. 3B, the alignment marks 108, 208 are abutting at the interface without overlapping. The material of the alignment marks 108, 208 is the same as the bonds of the bond patterns 104, 205. Usually, the dielectric material of one substrate would cover over the grating pattern of the alignment mark in another substrate.

As looking into in the invention, the bonding process including two stages of dielectric bonding and annealing bonding. The dielectric bonding is to preliminarily align the bonds such as copper bond of the bonding pattern 104, 204 based on alignment marks 108, 208. In an embodiment, the location of the substrate mat be adjusted during the dielectric bonding since the bonding force at this stage is rather weak and then the substrate is still movable. Therefore, before actually performing the annealing bonding, the alignment marks 108, 208 are monitored by the IR device to have the alignment as intended.

Then, the annealing bonding in relative high temperature is to firmly connect the metal bonds of the bonding pattern 104, 204. In the high temperature, the interface between the substrate 100, 200 may include the portion between dielectric and metal. Further noted, according to the structure in FIG. 3A or FIG. 3B, the alignment mark 108, 208 in one of the two substrates 100, 200 would be fully covered by dielectric layer 106, 206 of another one of the two substrate 100, 200. In an example, the alignment mark 108 of the substrates 100 would be fully covered by dielectric layer 106 of the substrates 200.

Further looking into the interface between the dielectric and metal bond at the high annealing temperature, a void would occur.

Figure 4A:
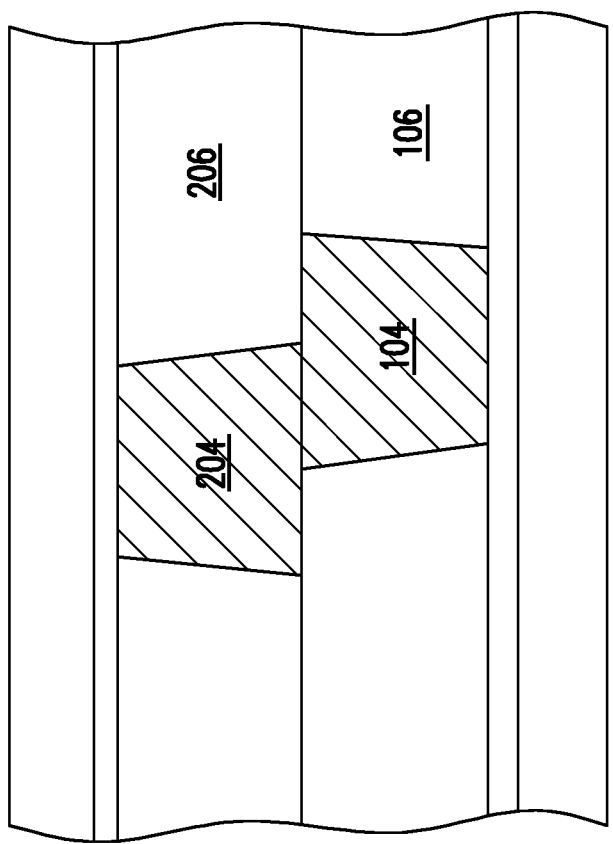
FIG. 4A is a drawing, schematically illustrating a cross-section structure of bonds in two substrates with misalignment after bonding, according to an embodiment of the invention.

As to the bonding condition between the bonds of the bond patterns 104, 204. The situations of proper alignment and misalignment are illustrated. FIG. 4A is a drawing, schematically illustrating a cross-section structure of bonds in two substrates with misalignment after bonding, according to an embodiment of the invention.

Referring to FIG. 4A, one bond of the bond pattern 104 surrounded by the dielectric layer 106 and one bond of the bond pattern 204 surrounded by the dielectric layer 206 are illustrated. The bonds between the bond patterns 104, 204, ideally, are well aligned. In this situation, the dielectric layers 106, 206 and the bonds 204, 204 are well matched at the interface between the two substrates. The metal material, such as copper, are well connected during the annealing bonding stage and the dielectric layers 106, 206 are also well bonded during the dielectric bonding stage.

Figure 4B:
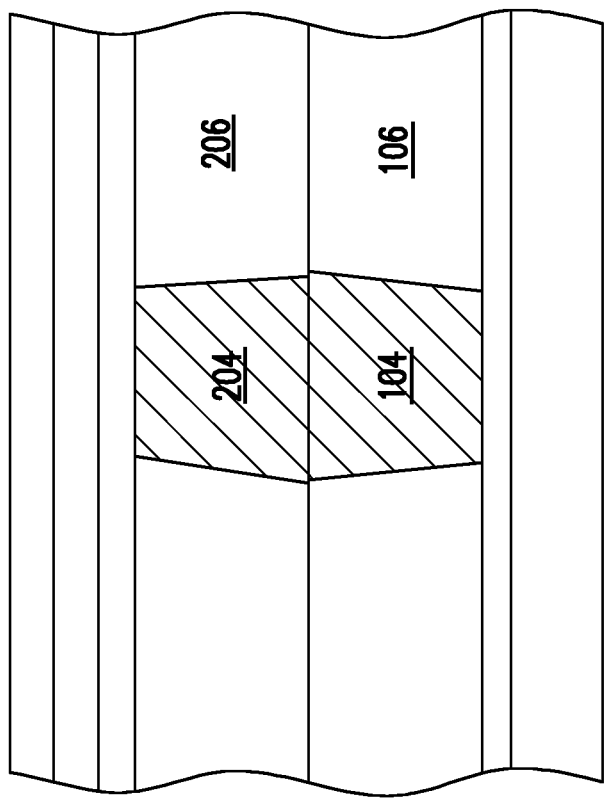
FIG. 4B is a drawing, schematically illustrating a cross-section structure of bonds in two substrates as well aligned after bonding, according to an embodiment of the invention.

FIG. 4B is a drawing, schematically illustrating a cross-section structure of bonds in two substrates as well aligned after bonding, according to an embodiment of the invention. Referring to FIG. 4B, a misalignment between the bonds of the bond patterns 204, 204 are illustrated. When severe misalignment occurs between the bonds of the bond patterns 204, 204, the electric contact portion is greatly reduced and the portion of the interface between the dielectric layer 106, 206 are also greatly increased. It would at least cause an issue at this portion of the interface.

Figure 5:
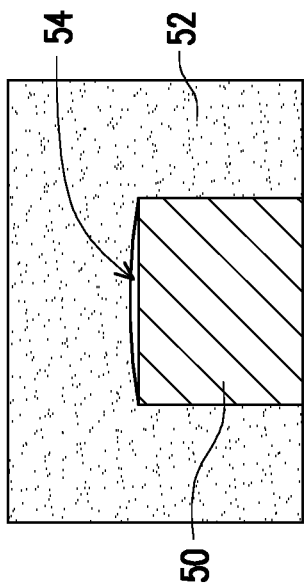
FIG. 5 is a drawing, schematically illustrating a potential defect at the interface between the dielectric and the metal bond, according to an embodiment of the invention.

FIG. 5 is a drawing, schematically illustrating a potential defect at the interface between the dielectric and the metal bond, according to an embodiment of the invention. Referring to FIG. 5, as looking into in the invention, a void 54 would potentially occur at the interface between the dielectric material 52 and the metal material 50 under the high temperature, such as the annealing temperature.

Further, the void would be more potentially occur between the dielectric layer 106, 206 and the alignment masks 108, 208. In this situation, the quality of the alignment marks 108, 208 as viewed by the IR device may gets larger error. The alignment precision would get worse. The alignment between the bond patterns 104, 204 may be affected, accordingly.

Figure 6A:
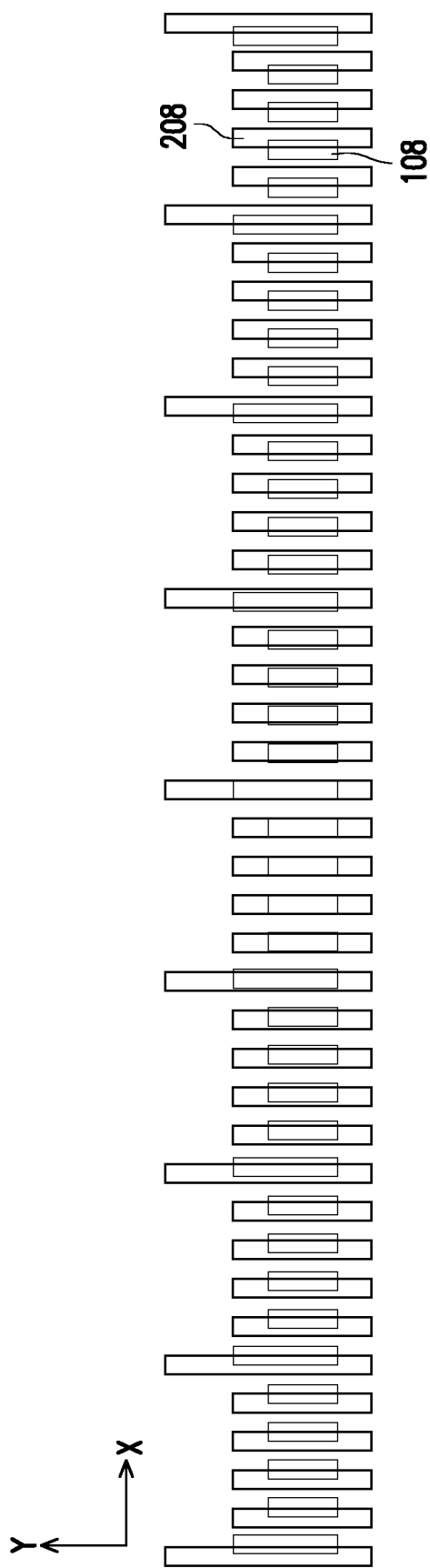
FIG. 6A is a drawing, schematically illustrating a structure of the alignment marks of the two substrates in plane view after bonding, according to an embodiment of the invention.

After looking into the issues above, the invention in an embodiment proposes the structure of the alignment mark with overlapping as viewed in plane view. FIG. 6A is a drawing, schematically illustrating a structure of the alignment marks of the two substrates in plane view after bonding, according to an embodiment of the invention.

Referring to FIG. 6A, in an embodiment, in the plane view of the substrate, the bars of the grating pattern of the alignment mark 108 is overlapping with the bars of the grating pattern of the alignment mark 208. In an embodiment, the bars are extending along a direction, such as the Y-axis while the bars are distributed along the direction such as X-axis. Here, in an embodiment, the alignment mark 208 of the substrate 200 may be disposed on the alignment mark 108 of the substrate 100. However, the grating patterns of the two substrates 100, 200 may be exchanged, without specific limitation in the invention.

In the structure of FIG. 6A as an embodiment, the bars of the grating pattern of the alignment mark 108 may be shorter than the bars of the grating pattern of the alignment mark 208. The bars of the grating pattern of the alignment mark 108, 208 are like the indication bars of a ruler, in which every five bars is relative longer than the adjacent bars. However, the gap between the adjacent two bars of the alignment mark 108 is different from the gap between the adjacent two bars of the alignment mark 208.

This setting is similar to the measurement mechanism of the Vernier caliper to look for the match bars of the two grating patterns of the alignment marks 104, 204 for determining the relative locations between the two substrate 100, 200. Generally, the central bar of the grating pattern of the alignment mark 108, 208 is set to be matched when the substrate 100 is aligned to the substrate 200 in ideal condition. If the matched bars are shifted from the central bar, a misalignment occurs and the shifted amount is determined by the location of the matched bars.

Figure 6B:
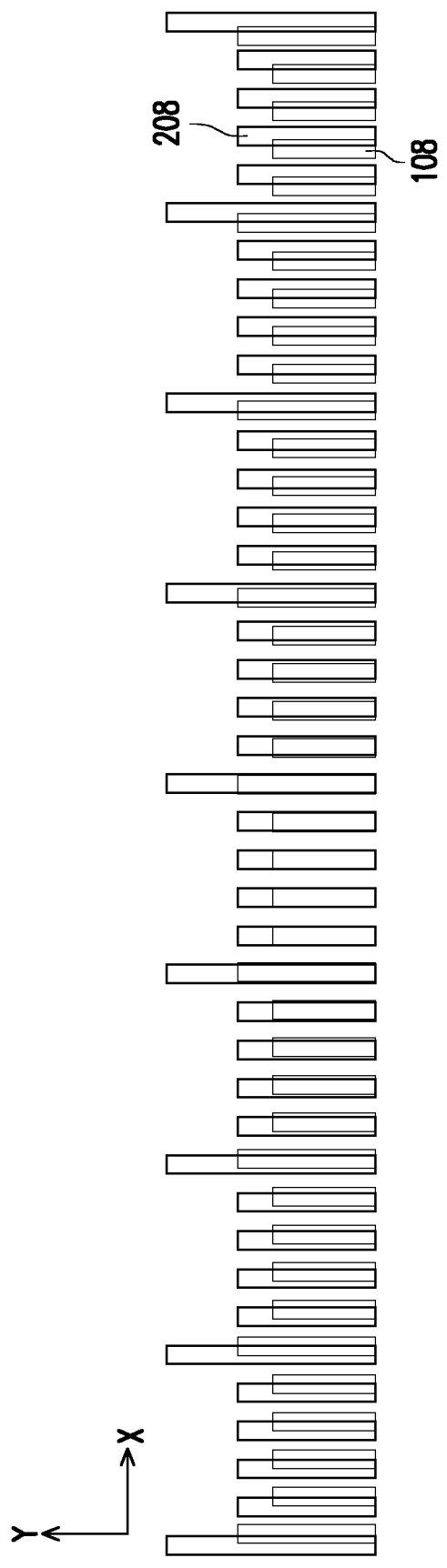
FIG. 6B is a drawing, schematically illustrating a structure of the alignment marks of the two substrates in plane view after bonding, according to an embodiment of the invention.

The overlap between the two gating patterns of the alignment marks 104, 204 may have other arrangement. FIG. 6B is a drawing, schematically illustrating a structure of the alignment marks of the two substrates in plane view after bonding, according to an embodiment of the invention. Referring to FIG. 6B, one side of each bar may be set to distribute along a straight line. The other geometric settings may be the same as those in FIG. 6A.

As noted, the two gating patterns of the alignment marks 104, 204 overlapped in plane view. The geometric relation in the FIG. 6A or FIG. 6B is the image taken by the IR device from top plane of the substrate, as also referring to FIG. 2. In this situation, a significant portion of the bars are overlapped during the annealing bonding stage at high temperature. The void 54 in FIG. 5 is effectively reduced for the alignment marks 104, 204 because the less portion of the bars is covered by the dielectric layer from the opposite substrate.

FIG. 7 is a drawing, schematically illustrating schematically illustrating a structure of the alignment marks of the two substrates in plane view after bonding as well aligned, according to an embodiment of the invention. Referring to FIG. 7, in an embodiment, to easily measure the shift between the two substrates. The bars of the grating pattern of the alignment mark of one of the substrates 100, 200 may be numbered for easy measuring the shift between the two substrates. In an example, the bars of the grating pattern of the alignment mark 208 are numbered for easy discerning the bars. As usual, one of the bars is the reference bar and numbered as 0 in an example. Basically, one of the bars in the grating pattern of the alignment mark 108 would match to one of the bars in the grating pattern of the alignment mark 208 because the gap between adjacent two bars in two alignment marks 104, 204 are different.

In a situation with precise alignment between the alignment mark 108 and the alignment mark 208, the match bar is located at the reference bar, as numbered by 0.

FIG. 8 is a drawing, schematically illustrating structure of the alignment marks of the two substrates in plane view after bonding with misalignment as measured, according to an embodiment of the invention. Referring to FIG. 8, when misalignment occurs, the shift amount may be easily measured. In an example, a misalignment by shift toward right by 5 bars, the bars of the alignment mark 208 and the bars of the alignment mark 108 have a match bar at the fifth bar. Further in an example, when more misalignment occurs, the bars of the alignment mark 208 and the bars of the alignment mark 108 have a match bar at the tenth bar. This, the misalignment with the shift amount may be easily measured.

Due to overlapping between the bars, the portion for bars being contacting to the dielectric material is also effectively reduced. The void 54 as illustrate in FIG. 5 in an example may be reduced.

In bonding process, as previously stated, the dielectric bonding stage causes the weak bonding of the dielectric layers 106, 206 at the interface between the two substrates 100, 200. The alignment condition is optically checked by analyzing an overlapping image of the grating pattern of the alignment mark 108 and the grating pattern of the alignment mark 208. The image may be shot by infra-red light of IR device. Once the alignment is done, in which the match bar is located t the reference bar numbered by "0", the annealing process may be performed to actually bond the be bond pads 104, 204, while the alignment marks 108, 208 are also bonded.

Figure 9:
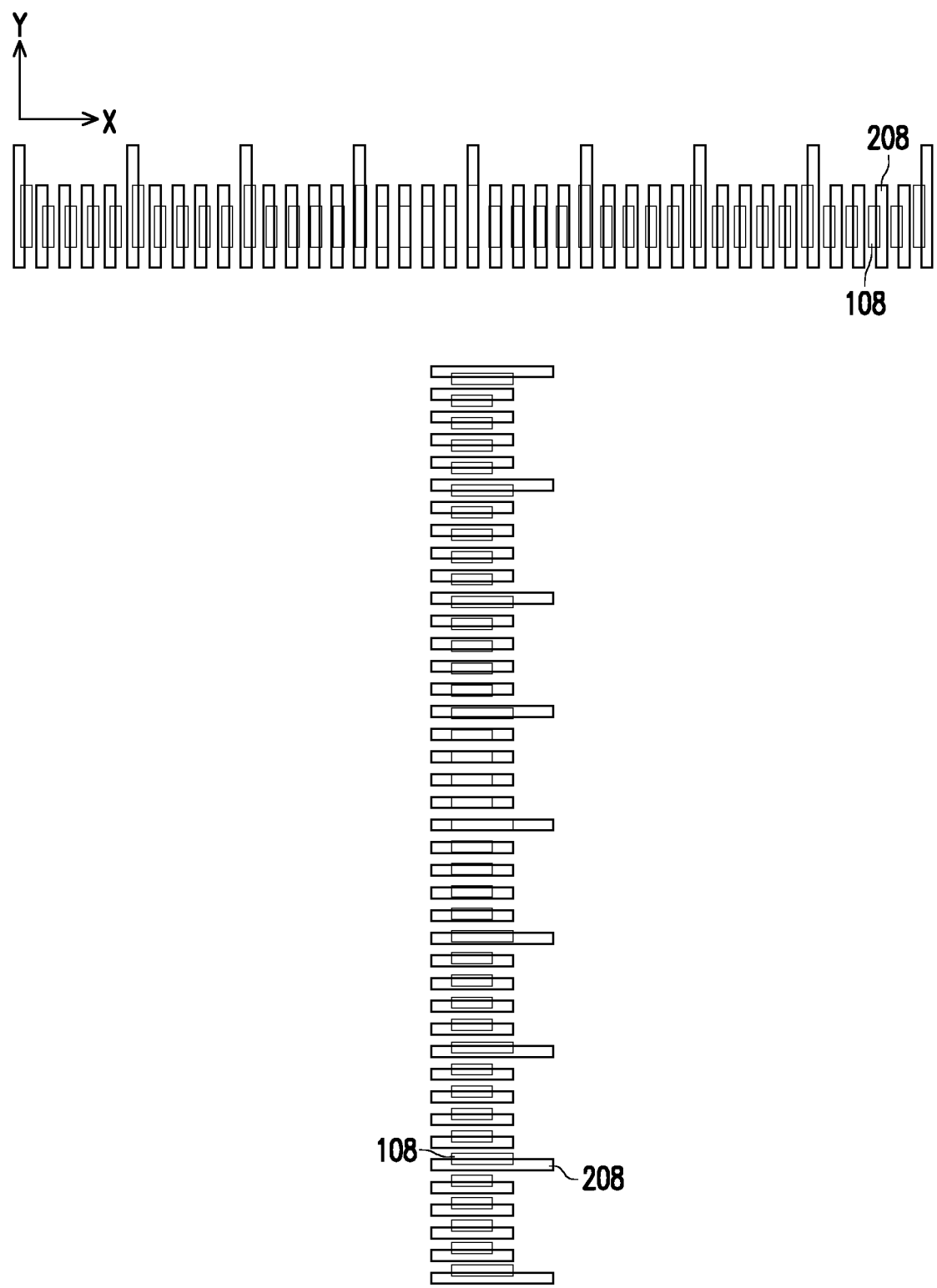
FIG. 9 is a drawing, schematically illustrating a structure of the alignment marks of the two substrates in plane view after bonding, according to an embodiment of the invention.

FIG. 9 is a drawing, schematically illustrating a structure of the alignment marks of the two substrates in plane view after bonding, according to an embodiment of the invention. Referring to FIG. 9, to actually align the two substrate 100, 200, it needs to align in both the X direction and the Y direction. In this situation, the alignment marks 108, 208 may be additional set in another direction, in which the bars are extending along the X direction while the bars are distributed along the Y direction. Two-dimension alignment may be done with the same design aspect.

Further in an embodiment, a method for bonding two substrates may be also provided. In an embodiment, the method includes providing a first substrate 100, having a first bonding pattern of 104 and a first grating pattern of alignment mark 108 at a top of the first substrate 100. The first grating pattern of alignment mark 108 has a plurality of first bars extending along X direction. In addition, a second substrate 200 is provided, having a second bonding pattern 204 and a second grating pattern of alignment mark 208 at a top of the second substrate 200. The second grating pattern of alignment mark 208 has a plurality of second bars extending along the X direction. The first bonding pattern of alignment mark 108 is dielectric bonding to the second bonding pattern of alignment mark 208, wherein an alignment condition between the first grating pattern and the second grating pattern is optically checked and accordingly adjusted to satisfy within a range. Annealing bonding is performed on the first bonding pattern 104 and the second bonding pattern 204 to have metal bonding. One of the first grating pattern of alignment mark 108 and the second grating pattern of alignment mark 208 is stacked over and overlapping at the X direction with another one of the first grating pattern of alignment mark 108 and the second grating pattern of alignment mark 208. A first gap between adjacent two of the first bars of the first grating pattern of alignment mark 108 is different from a second gap between adjacent two of the second bars of the first grating pattern of alignment mark 208.

The invention has provided the alignment marks with overlapping as viewed at the plane view. The misalignment may be easily detected and measured, and the alignment marks may be fabricated in improved structure with reducing the occurrence of void at the interface between dielectric and metal during the bonding process.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of semiconductor device, comprising:
a first bonding pattern, formed on a first substrate;
a first grating pattern, disposed on the first substrate, having a plurality of first bars extending along a first direction;
a second bonding pattern, formed on a second substrate; and
a second grating pattern, disposed on the second substrate, having a plurality of second bars extending along the first direction,
wherein the first bonding pattern is bonded to the second bonding pattern,
wherein one of the first grating pattern and the second grating pattern is stacked over and overlapping at the first direction with another one of the first grating pattern and the second grating pattern,
wherein a first gap between adjacent two of the first bars is different from a second gap between adjacent two of the second bars.

2. The structure of claim 1, wherein a bar end of the first bars is matched to a bar end of the second bars at one side of the first bars.

3. The structure of claim 1, wherein a bar end of the first bars is constantly shifted from a bar end of the second bars at one side of the first bars.

4. The structure of claim 1,
wherein one of the first bars and the second bars is numbered as a plurality of numbered bars while another one is a plurality of comparison bars,
wherein the numbered bars have a reference bar assigned with a reference number, wherein a misalignment level is determined by a shift from the reference bar for a detected one of the numbered bars being most matching to one of the comparison bars.

5. The structure of claim 4, wherein the reference number as assigned to the reference bar is "0", a first side with respect to "0" is negatively numbered and a second side with respect to "0" is positively numbered.

6. The structure of claim 1, wherein the first bars are longer than the second bars or the first bars are shorter than the second bars.

7. The structure of claim 1, further comprising:
a third grating pattern, disposed on the first substrate, having a plurality of third bars extending along a second direction perpendicular to the first direction; and
a fourth grating pattern, disposed on the second substrate, having a plurality of fourth bars extending along the second direction,
wherein one of the third grating pattern and the fourth grating pattern is stacked over and overlapping at the second direction with another one of the third grating pattern and the fourth grating pattern,
wherein a third gap between adjacent two of the third bars is different from a fourth gap between adjacent two of the fourth bars.

8. The structure of claim 7, wherein a bar end of the third bars is matched to a bar end of the fourth bars at one side of the first bars.

9. The structure of claim 7, wherein a bar end of the third bars is constantly shifted from a bar end of the fourth bars at one side of the first bars.

10. The structure of claim 7,
wherein one of the third bars and the fourth bars is numbered as a plurality of numbered bars while another one is a plurality of comparison bars,
wherein the numbered bars have a reference bar assigned with a reference number, wherein a misalignment level is determined by a shift from the reference bar for a detected one of the numbered bars being most matching to one of the comparison bars.

11. The structure of claim 10, wherein the reference number as assigned to the reference bar is "0", a first side with respect to "0" is negatively numbered and a second side with respect to "0" is positively numbered.

12. The structure of claim 7, wherein the third bars are longer than the fourth bars or the third bars are shorter than the fourth bars.

13. A method for bonding two substrates, comprising:
providing a first substrate, having a first bonding pattern and a first grating pattern at a top of the first substrate, wherein the first grating pattern has a plurality of first bars extending along a first direction;
providing a second substrate, having a second bonding pattern and a second grating pattern at a top of the second substrate, wherein the second grating pattern has a plurality of second bars extending along the first direction; and
dielectric bonding the first bonding pattern to the second bonding pattern, wherein an alignment condition between the first grating pattern and the second grating pattern is optically checked and accordingly adjusted to satisfy within a range; and
annealing bonding the first bonding pattern and the second bonding pattern to have metal bonding,
wherein one of the first grating pattern and the second grating pattern is stacked over and overlapping at the first direction with another one of the first grating pattern and the second grating pattern,
wherein a first gap between adjacent two of the first bars is different from a second gap between adjacent two of the second bars.

14. The method of claim 13, wherein a bar end of the first bars is matched or constantly shifted from a bar end of the second bars at one side of the first bars.

15. The method of claim 13,
wherein one of the first bars and the second bars is numbered as a plurality of numbered bars while another one is a plurality of comparison bars, wherein the numbered bars have a reference bar assigned with a reference number, wherein a misalignment level is determined by a shift from the reference bar for a detected one of the numbered bars being most matching to one of the comparison bars.

16. The method of claim 15, wherein the reference number as assigned to the reference bar is "0", a first side with respect to "0" is negatively numbered and a second side with respect to "0" is positively numbered.

17. The method of claim 13, wherein the first bars are longer than the second bars or the first bars are shorter than the second bars.

18. The method of claim 13, wherein the first substrate and the second substrate as provided further comprising:
- a third grating pattern, disposed on the first substrate, having a plurality of third bars extending along a second direction perpendicular to the first direction; and
- a fourth grating pattern, disposed on the second substrate, having a plurality of fourth bars extending along the second direction,
- wherein one of the third grating pattern and the fourth grating pattern is stacked over and overlapping at the second direction with another one of the third grating pattern and the fourth grating pattern,
- wherein a third gap between adjacent two of the third bars is different from a fourth gap between adjacent two of the fourth bars.

19. The method of claim 18,
- wherein one of the third bars and the fourth bars is numbered as a plurality of numbered bars while another one is a plurality of comparison bars,
- wherein the numbered bars have a reference bar assigned with a reference number, wherein a misalignment level at the second direction is determined by a shift from the reference bar for a detected one of the numbered bars being most matching to one of the comparison bars.

20. The method of claim 18, wherein the third bars are longer than the fourth bars or the third bars are shorter than the fourth bars.

21. The method of claim 13, wherein the alignment condition is optically checked by analyzing an overlapping image of the first grating pattern and the second grating pattern as shot by infra-red light.

* * * * *